United States Patent [19]

Lissalde et al.

[11] Patent Number: 4,600,564
[45] Date of Patent: Jul. 15, 1986

[54] MACHINE FOR PULLING MONOCRYSTALS

[75] Inventors: Francois Lissalde, Seyssinet; Pierre Bathelet, Brignoud; Bruno Ferrieu, Seyssinet; Michel Brochier, Haute Jarrie, all of France

[73] Assignee: Crismatec, Gieres, France

[21] Appl. No.: 647,178

[22] Filed: Sep. 4, 1984

[30] Foreign Application Priority Data

Sep. 6, 1983 [FR] France .................. 83 14219

[51] Int. Cl.$^4$ .................................. B01D 9/00
[52] U.S. Cl. ........................... 422/249; 156/601; 156/617 SP
[58] Field of Search .......... 422/249; 156/601, 617 SP, 156/617 V, DIG. 98

[56] References Cited

U.S. PATENT DOCUMENTS

| 2,975,036 | 3/1961 | Taylor | 23/273 |
| 3,934,983 | 1/1976 | Bardsley et al. | 156/617 SP |
| 4,176,002 | 11/1979 | Quenisset et al. | 156/617 SP |
| 4,190,630 | 2/1980 | Apilat et al. | 156/617 SP |
| 4,218,424 | 8/1980 | Floymayr et al. | 422/249 |
| 4,258,003 | 3/1981 | Hurle et al. | 156/601 |
| 4,285,911 | 8/1981 | De Brouckere | 422/249 |
| 4,539,067 | 9/1985 | Washizuka et al. | 156/601 |

FOREIGN PATENT DOCUMENTS

| 0154224 | 3/1982 | Fed. Rep. of Germany | 156/619.1 |
| 1027662 | 4/1966 | United Kingdom | 156/617.1 |

OTHER PUBLICATIONS

Journal of Crystal Growth, vol. 41, No. 2, Dec. 1977, North-Holland Publishing Company.

Primary Examiner—S. Leon Bashore
Assistant Examiner—Michael K. Boyer

[57] ABSTRACT

The invention relates to a monocrystal pulling head. A carriage carrying the vertical pulling spindle, in which is placed a weight transducer, moves parallel to said axis under the action of a torque motor, which is controlled in position and speed and which is directly connected to the threaded rod of a screw - nut system. During its displacement, the carriage is guided by a rail, on which roll at least two pairs of rollers. A torque motor is mounted in the carriage for directly rotating the pulling spindle. Thus, the spindle displacement speeds are very accurately controlled. An electronic system integral with the pulling spindle processes the signals from the weight transducer. Contactless means make it possible to supply the electronic system, feed the useful information to the fixed parts and return thereto control instructions.

9 Claims, 3 Drawing Figures

MACHINE FOR PULLING MONOCRYSTALS

BACKGROUND OF THE INVENTION

The present invention relates to a head for pulling monocrystals from a molten product bath. This bath is contained in a crucible and is kept at a temperature above the melting point of the product by appropriate heating means. It is then possible to obtain a solid crystal with the aid of a monocrystalline nucleus of the same product placed at the lower end of a vertically axed pulling spindle, in accordance with the so-called Czochralski method.

The pulling heads of this type are mainly used for the crystallization of materials for which it is possible to find conditions where the crystallized solid has the same composition as the liquid (congruent melting body) such as certain oxides and semiconductors of the silicon and germanium types.

In such machines, the monocrystalline nucleus is brought into contact with the liquid bath, whose temperature is adjusted in such a way that at the solid-liquid interface the conditions are such that at each instant the crystallized atom quantity is identical to the atom quantity returning in the melt. Growth is obtained by exerting a regular vertical translatory movement on the pulling spindle at a speed which is generally between 1 and 30 mm per hour. In order to check the shape of the interface, on the translatory movement is superimposed a rotary movement of the spindle about its axis at a speed which is generally between 0 and 100 revolutions per minute. The upwards displacement of the solid-liquid interface brings the latter into a colder zone, which has the effect of crystallizing the bath on the nucleus and thus making the monocrystal grow.

Due to the slowness of the vertical translatory movement applied to the pulling spindle during a crystalline growth, it is conventional practice to provide the monocrystal pulling heads with fast spindle translation means, in order to bring about the lowering of the nucleus to the vicinity of the molten bath.

In the present state of the art, the slow and fast translatory displacements of the spindle are controlled by two conventional electric motors acting on a ball circulation system via a clutch and reduction gear. In the same way, the spindle is rotated by a geared motor system. The use of motors and reduction gears is obviously very costly. Moreover, the presence of these reduction gears introduces clearances and vibrations, which are prejudicial to the regularity of the movement required during the pulling of the monocrystal. Moreover, the use of a ball circulation system produces impacts during the slow displacement of the pulling spindle. The quality of the monocrystals obtained is reduced, particularly due to the presence of dislocations in these monocrystals.

The necessity of obtaining monocrystals with a regular geometry has led machine manufacturers to develop diameter regulations. In existing machines, where said regulation takes place by means of a weight measurement, a suitably positioned transducer continuously records either the weight increase of the crystal, or the mass loss of the molten bath.

The crucible weighing method is simple but, for experimental reasons, involves the unnecessary weighing of the refractory required for the thermal insulation of the system. Moreover, the measurement is subject to error resulting from the levitation forces exerted on the crystal in the case of a high frequency heating.

The method used in the present invention is the weighing of the crystal during growth. This method does not suffer from the disadvantages referred to hereinbefore and involves the insertion of a weight transducer into the spindle. This transducer is necessarily rotated by the latter.

According to the prior art, in order to supply information to the fixed parts, return instructions to the rotary part and supply the rotating transducer with electric power, it is necessary to use relatively unreliable revolving contacts, which have a limited service life.

SUMMARY OF THE INVENTION

The present invention specifically relates to a head for pulling monocrystals according to the Czochralski method, which does not suffer from the disadvantages of known machines and which more particularly permits slow vertical displacement and rotary movements of the pulling spindle which are significantly more regular, whilst having a relatively simple design and a relatively low price.

Moreover, the present invention also aims at considerably improving the reliability of pulling heads, by eliminating any revolving contact between the rotating parts and the fixed parts of the machine, with the exception of the motor brushes and the tacho-generators.

The present invention therefore proposes a monocrystal pulling head having a fixed frame, a carriage which is movable with respect to said frame in a direction parallel to the pulling spindle axis, under the action of means for controlling the translation of said carriage in accordance with at least two different speeds, the carriage supporting the pulling spindle via means for controlling the rotation thereof about its own axis. The means for controlling the translation of the carriage comprises a single torque motor, which is controlled in position and speed and which is directly connected to a screw-nut system placed between the carriage and the frame, as well as means for guiding the carriage with respect to the frame.

In a comparable manner, the means for controlling the rotation of the pulling spindle preferably comprise a second speed-controlled torque motor, which is directly connected to the pulling spindle.

According to a preferred embodiment of the invention, the pulling spindle is made in two parts connected by a weight transducer supplying electrical signals transmitted to a first electronic processing circuit, which is placed very close to the transducer and is integral with the pulling spindle, so as to limit to the maximum extent the production of interference.

Preferably, in order to improve the stability of the system with respect to surrounding thermal fluctuations, the weight transducer is placed in a thermally insulating enclosure integral with the said carriage.

With the same objective, the pulling head comprises a temperature detecting device and a heating means placed in the said enclosure, an external regulating circuit sensitive to the signal supplied by the temperature detecting device controlling the realisation of the heating means, in order to maintain the temperature on the weight transducer at a constant value.

Moreover, each of the parts of the spindle has at least one area made from insulating material in the vicinity of the weight transducer.

The electrical signal supplied by the first processing circuit can be transmitted to a second processing circuit, which is independent of the pulling spindle, by an electrooptical system incorporating an optoelectronic transmitter and receiver, such as a photodiode and a phototransistor facing one another along the spindle axis and respectively integral with the first processing circuit and the carriage.

The electrical power supply for the first processing circuit can be obtained by a source which is independent of the pulling spindle and which is electrically connected in contactless manner to the first processing circuit by a transformer positioned between the carriage and the spindle.

Means independent of the pulling spindle can also be provided for supplying control instructions, which are transmitted in contactless manner to the first processing circuit by capacitive coupling means positioned between the carriage and the pulling spindle.

The simultaneous use of an optoelectronic channel, a capacitive channel and a rotary transformer makes it possible to obviate any need for a revolving contact in the transmission of information between the pulling spindle and the fixed parts of the machine.

Preferably, the weight transducer comprises an internal part and an external part, which are respectively integral with each of the two parts of the pulling spindle and which are centered along the axis of the latter, respectively by a projecting portion of the inner part located in a blind hole of the corresponding portion of the spindle and by a bevel shoulder.

According to another aspect of the pulling head according to the invention, the carriage comprises a first portion carrying the guidance means and on which acts the screw-nut system, a second portion carrying the pulling head and means for controlling the rotation thereof, the system constituted by the second portion of the carriage and by the pulling spindle essentially having a symmetry of revolution about the axis of said spindle, and rigid, regulatable connecting means between the two portions of the carriage, so that the spindle axis can be given the desired vertical orientation.

The means for guiding the carriage relative to the frame can be constituted by a guide rail fixed to the frame and on which roll rollers carried by the carriage, as well as by any equivalent means such as an air cushion system.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

It is firstly pointed out that the pulling machine according to the invention essentially differs with respect to the prior art machines with regards to the pulling head, i.e. the means making it possible to control the vertical translation of the pulling spindle along its axis and means for controlling the rotation of this spindle about said axis. It can be gathered from this preliminary remark that all parts of the machine which are not described and shown will be constructed in accordance with prior art techniques and on the basis of the knowledge of the Expert.

In particular, when the molten bath is converted into a monocrystal during the rising of the pulling spindle, there is a reduction in the level of this bath in the crucible which makes it necessary, in order to maintain constant the crucible growth rate and maintain fixed the solid-liquid interface position in the thermal gradient, to slowly move the crucible upwards and correlatively to modify the pulling speed. The means for controlling the displacement of the crucible do not form part of the present invention and can be realised by any appropriate means and will not be described in the present specification.

Figure 1:
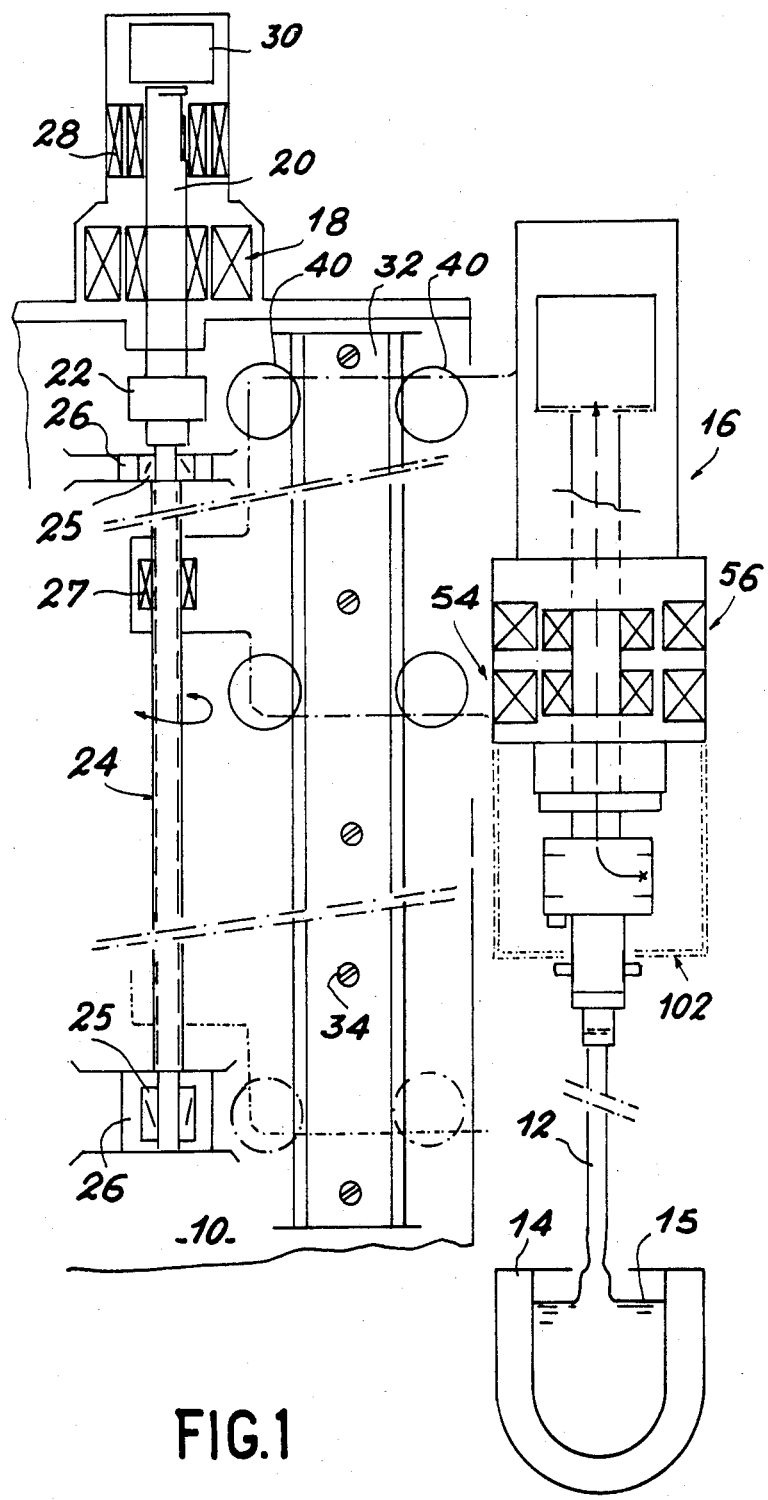
FIG. 1 a front view showing in diagrammatic manner a monocrystal pulling machine constructed according to the invention.

FIG. 1 shows part of the machine frame 10 supporting the vertically axed pulling spindle 12 above the crucible 14, which is filled with a bath 15 of molten product to be crystallized, via a carriage 16 which is vertically movable with respect to the frame 10.

The control of the vertical displacement of carriage 16 relative to frame 10 is realised by a torque motor 18, mounted in the upper part of the frame, so as to directly rotate a vertically axed shaft 20, whose lower end is fixed by a coupling 22 of a vertically axed threaded rod 24, mounted in rotary manner in the pins 26 integral with frame 10, via bearings 25. Like all the other bearings of the machine, bearings 25 have an oblique contact and no clearance or have a deep groove.

A nut 27, integral with carriage 16 is received on the threaded rod 24, in such a way that the rotation thereof by torque motor 18 has the effect of bringing about a vertical translatory movement of carriage 16.

The use of a torque motor 18 permits particularly gentle movements and eliminates the reduction gears and clutches used in the prior art. Moreover, a single torque motor makes it possible to control both the slow displacements (translation speed controllable at random between 1 and 30 mm per hour for pulling) and fast displacements (translation speed 95 mm per minute for the approach) of the pulling spindle.

In order to ensure the regularity of these displacements, particularly during the pulling of the monocrystal, torque motor 18 is controlled in speed and position. For this purpose, with the motor 18 is associated a speed transducer, such as a tacho-generator 28 and a position coder, such as a synchroresolver 30. For simplification purposes, FIG. 1 does not show the control loops by which the signal supplied by the tacho-generator and synchroresolver make it possible to bring about a speed and position control of torque motor 18. Such control loops are in fact well known in the art and do not form part of the present invention.

Moreover, the control of the torque motor 18 from the control console, in order to regulate the speed and displacement direction of the pulling spindle 12, can be realised by any appropriate means and will not be described in detail here.

Figure 2:
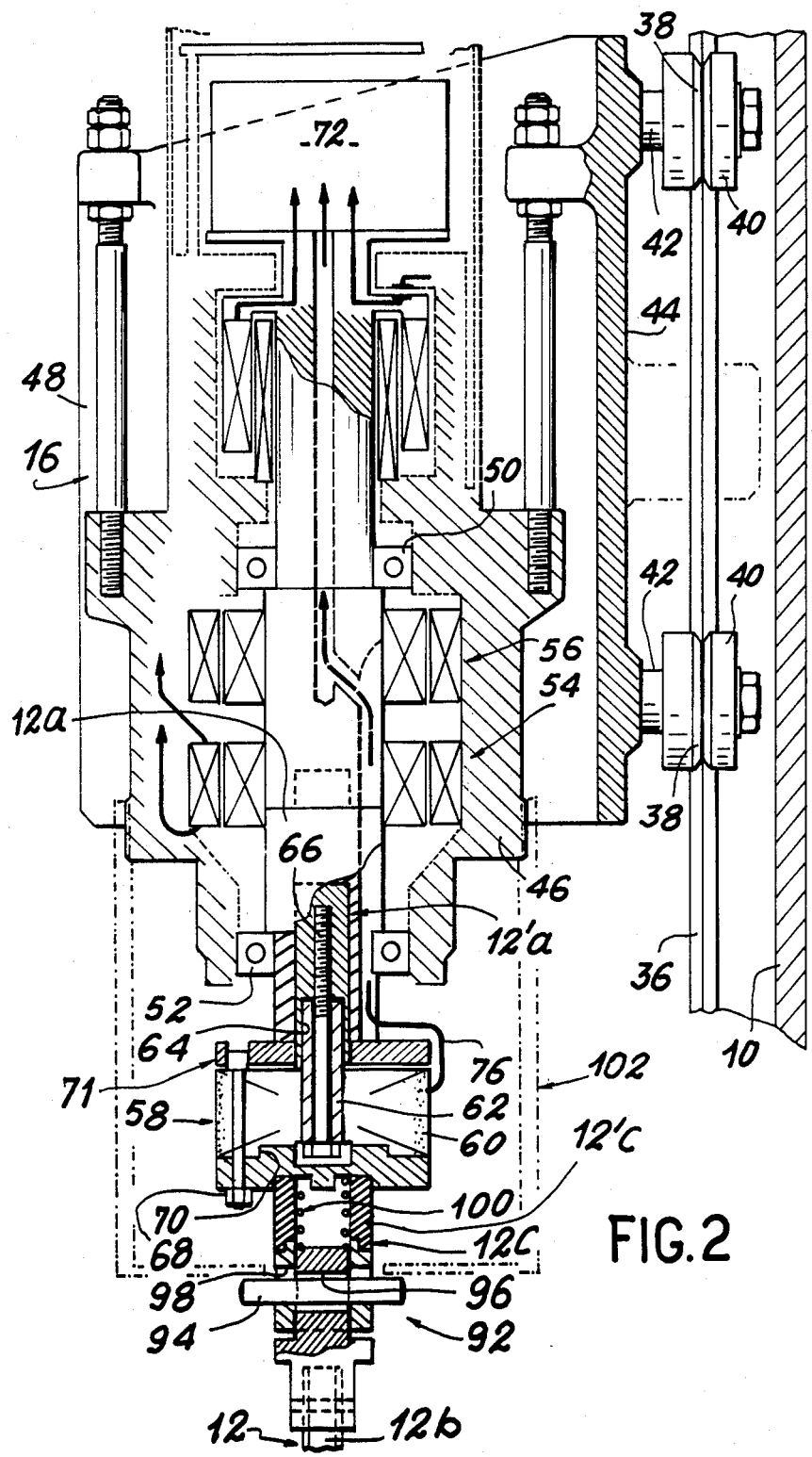
FIG. 2 a larger scale, part sectional, side view showing in greater detail the upper part of the pulling spindle and the carriage supporting the same.

According to another feature of the invention, the vertical translatory displacement of the carriage 16 carrying the pulling spindles 12, with respect to the frame 10, is guided by appropriate means separate from the nut-screw system 24, 27. In the embodiment of FIGS. 1 and 2, said guidance means are constituted by a rail or a straightened vertical slide 32 fixed to frame 10, e.g. by means of screws 34 and whose vertical edges 36 have a V-shaped section. These edges 36 of rail 32 enter grooves 38 having the same section and formed in at least two pairs of straightened rollers 40, which are vertically displaced from one another. The spindles 42 of rollers 40 are integral with carriage 16.

Obviously, these guidance means could be constituted by any equivalent means and particularly by an air cushion guidance system, making it possible to reduce friction and consequently still further improve the regularity of displacement of carriage 16 relative to the frame.

No matter what the guidance system used, it should be noted that the displacement of the carriage relative to the frame takes place without impacts or vibrations, which is an important advantage compared with the prior art.

As is more particularly shown by FIG. 2, the carriage 16 has a first portion 44 carrying nut 27 and spindles 42 supporting the guidance rollers 40 and a second portion 46 having in general terms a symmetry of revolution about the vertical axis of the pulling spindle 12. Portion 46 of the carriage is suspended on portion 44 by rigid tie bolts, which have a regulatable length and are so circumferentially distributed about the spindle that they permit a very precise regulation of the vertical orientation of the spindle axis.

FIG. 2 also shows that the upper part of the pulling spindle 12 enters portion 46 of the carriage, in which it is suspended in rotary manner via an abutment 52 and a bearing 50 and once again without any clearance. The rotation of spindle 12 within portion 46 of the carriage is brought about with the aid of a second torque motor 54, which is speed-controlled by means of a speed transducer, such as a tacho-generator 56 and a known, not shown control circuit. It should be noted that the torque motor 54 is directly connected to spindle 12. In the same way as for motor 18, the control of motor 54 can be realised by any appropriate means and will not be described in detail here.

In the same way as for the translation control motor 18, torque motor 54 permits a particularly gentle movement and obviates any need for a mechanical reduction gear. The torque motor 54 makes it possible to impart to the pulling spindle a rotary movement which can be regulated between 0 and 100 revolutions per minute.

The speed stability obtained as a result of the torque motors 18 and 54 is better than 2.5%, which is a result much better than those obtained with the aid of known pulling machines, knowing that the system described here has no reduction gear.

In accordance with an interesting aspect of the invention, which more particularly permits the automatic immersion of the nucleus in the bath contained in the crucible, a weight transducer 58 is placed directly in the pulling spindle 12.

During the growth of the crystal, weighing carried out with the aid of transducer 58 represents, to within the weight of the lower part of the pulling spindle, the weight of the monocrystal. It therefore makes it possible for action to be taken on the heating power of the crucible, in order to regulate the diameter of the crystal obtained. This known procedure is improved according to the invention both by giving the transducer 58 a special construction making it possible to prevent any disturbing displacement between the axes of the two parts of the spindle connected by the transducer and by proposing an original solution to the problem posed by the transmission of the information supplied by the transducer fixed to the rotating spindle towards the non-rotating parts of the machine.

In per se known manner, the weight transducer 58 comprises an outer part 60 and an inner part 62, between which are arranged not shown deformation transducers, such as strain gauges.

In order to improve the alignment of the axes of the upper part 12a and the lower part 12b of the pulling spindle 12 compared with the prior art, it can be seen from FIG. 2 that the central portion 62 extends upwards and projects beyond the upper face of the outer portion 60, so as to enter a blind hole 64 formed in part 12a of the spindle, to which it is fixed by a screw 66. In a comparable manner, the outer part 60, which is fixed to the lower portion 12b of the pulling spindle by screws 68, is centered relative to said portion 12b by means of a bevel shoulder 70. Thus, it is possible to very accurately obtain the alignment of the axes of the two parts of the pulling spindle.

FIG. 2 also shows that a disk 71, having the same diameter as the outer portion 60, is fixed above the latter to the lower end of spindle portion 12a, e.g. by means of not shown screws. This disk 71, which defines with portion 60 a relatively small gap, constitutes an abutment serving to counterbalance the radial or compressive stresses, which could be accidentally applied to the transducer. For a good effectiveness of this abutment, the gap between disk 71 and portion 60 is preferably limited to approximately 1/10 mm.

In order to improve the stability of the system relative to surrounding thermal fluctuations, FIG. 2 shows that the weight transducer 58, as well as the entire area of the guidance spindle located between the lower end of carriage part 46 and the dismantlable device 93, which will be described hereinafter, are placed in an enclosure 102. The inner and outer faces of this enclosure are made from polished aluminum.

Moreover, means are provided for regulating the temperature within enclosure 102. These means include a temperature detecting device 104 and a heating member 106, fixed within enclosure 102, as well as an electronic regulating circuit 108 located in the not shown control console. Detecting device 104 and heating member 106 are electrically connected to circuit 108, as is diagrammatically illustrated by FIG. 3, in such a way that the heating member, controlled by circuit 108, makes it possible to stabilize the temperature as a function of the information supplied by the temperature detecting device. Thus, the temperature on the weight transducer can be stabilized, e.g. at around 35° C. Moreover, in order to eliminate the heat bridges existing between the external medium and the weight transducer 58, the portions 12'a and 12'c of the pulling spindle adjacent to the transducer are made from an insulating material, such as alumina.

Figure 3:
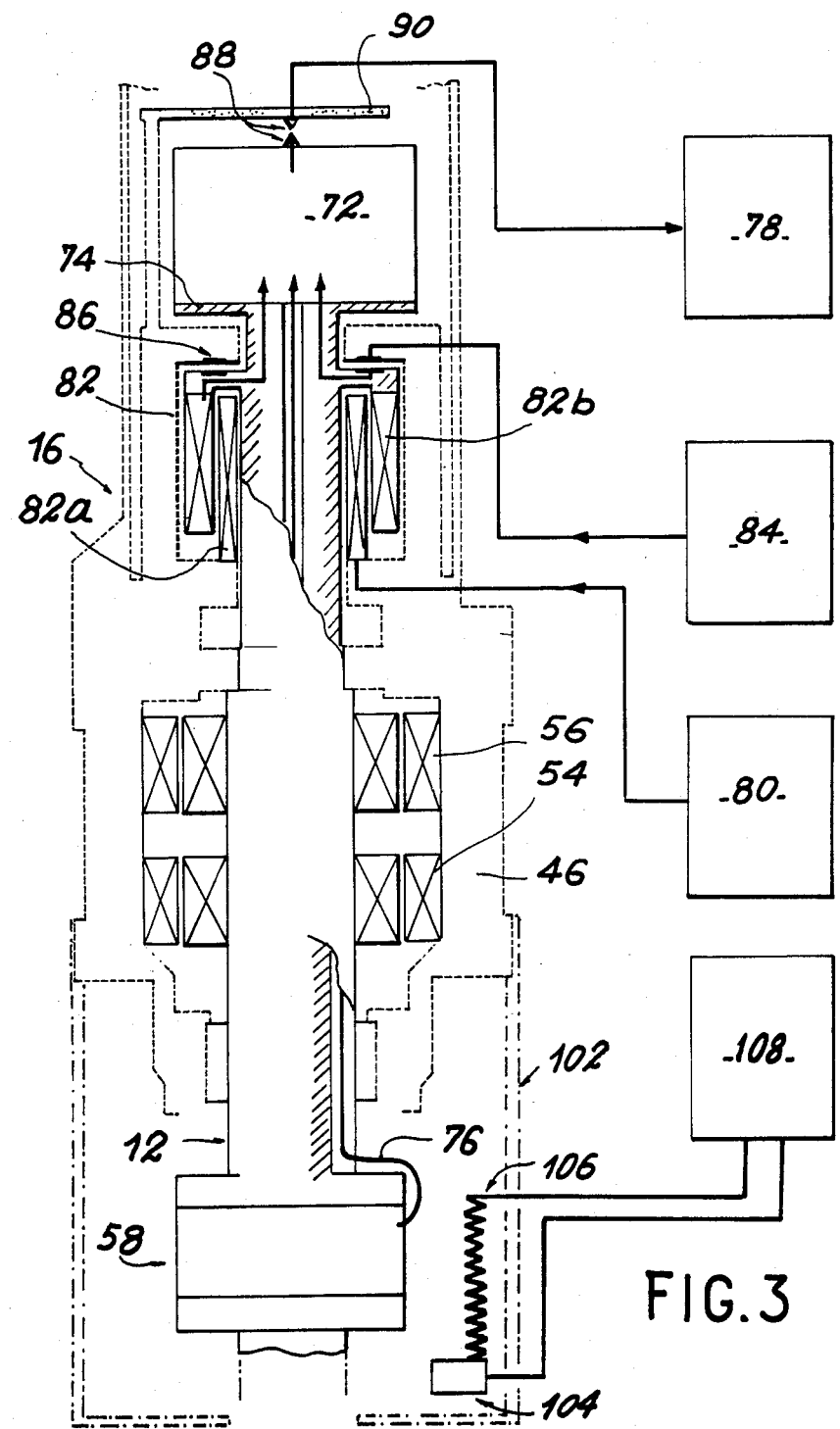
FIG. 3 a view comparable to FIG. 2, which more particularly illustrates the transmission of the signals between the pulling spindle and the machine control console.

In order to solve the problem of the transmission of the electric signal supplied by the weight transducer 58 to the non-rotary parts of the machine, it can be seen from FIG. 3 that different transmission techniques are used as a function of the nature of the signal, it being a common feature of these techniques to eliminate any revolving electrical contact between the spindle and part 46 of the carriage 16.

Firstly, and in order to reduce to the maximum the length of the electrical wires prior to the signal supplied by transducer 58 undergoing a first processing, which makes it possible to prevent the production of interference which could be prejudicial to the measurement, a first electronic circuit or preliminary processing circuit 72 is placed directly on a plate 74, mounted at the upper end of pulling spindle 12, above carriage part 46. The wires 76 make it possible to carry to circuit 72 the electrical signal supplied by the transducer 58, which pass through appropriate passages formed in the upper portion 12a of the pulling spindle, as shown in FIGS. 2 and 3.

The main functions of processing circuit 72 are to amplify the signal from the weight transducer, multiplex this amplified signal and ancillary analog quantities, such as temperature measurements and then convert all these quantities into a pulse train in a voltage-frequency converter, e.g. at 1 MHz.

Bearing in mind the different functions of processing circuit 72, it can be seen that three types of quantities must circulate between circuit 72 and different elements belonging to the not shown control console:
the supply voltage of circuit 72, supplied by a power supply source 80,
the multiplexing instructions of the quantities conditioned in circuit 72, as well as certain ancillary control instructions supplied by a computer 84,
the information supplied by circuit 72 and which must be transferred to the main processing circuit 78 located in the console.

Firstly, and as illustrated in FIG. 3, the supply voltage of circuit 72 supplied by source 80 is transmitted from the part 46 of carriage 16 to the circuit 72 rotating with spindle 12 by a rotary transformer 82, whose primary 82a is fixed to part 46 and is disposed within the secondary 82b, which is fixed to spindle 12.

The instructions supplied by computer 84 are transmitted to circuit 72 between part 46 and spindle 12, via a capacitive coupling system 86, e.g. on a carrier at 3 MHz.

Finally, the information supplied in the form of a pulse train by processing circuit 72 are transmitted to the main processing circuit 78 by an electrooptical transmitter-receiver system constituted by a photodiode and a phototransistor 88, positioned along the axis of spindle 12 in facing manner and respectively joined to the circuit 72 and a plate 90 fixed to carriage part 46.

In order to permit the interchangeability of that part of spindle 12 carrying the nucleus, FIG. 2 shows that the lower part 12b of the spindle is mounted by means of a dismantlable device 92 on an intermediate part 12c, which is itself connected to the upper part 12a via a weight transducer 58.

More specifically, the dismantlable device 92 is constituted by a pin 94, which simultaneously enters the e.g. square holes 96 to 98, which are respectively formed in the complementary ends of the pulling spindle parts 12b and 12c. The pin is maintained in position in the holes by a spring 100. This device has the advantage of permitting a very easily dismantling of the lower part 12b by exerting a slight upward pressure counter to spring 100, so as to disengage pin 94 from holes 96 and 98. Moreover, this device ensures a perfect centering, without any longitudinal or rotary clearance.

What is claimed is:

1. A machine for pulling Czochralski monocrystals from a bath of molten product contained in a crucible and kept at a temperature above the melting point of the product by appropriate heating means, a monocrystalline nucleus of said product being placed at the lower end of a pulling spindle having a vertical axis, said machine comprising a fixed frame; a carriage which is supported by said frame and movable with respect to said frame in a direction parallel to the axis of said pulling spindle and means for guidance of the carriage with respect to said frame; first control means for moving said carriage in said direction in at least two different speeds, said carriage rotatably supporting said pulling spindle about the axis of the latter; and second control means for rotating said pulling spindle about the vertical axis of said pulling spindle; said first control means comprising a single torque motor which is controlled in position and speed, said motor being mounted on said frame and directly connected to a screw, said screw being received in a nut mounted on said carriage, second control means comprising a second speed controlled torque motor mounted on said carriage and directly connected to said pulling spindle, said pulling spindle being in two separate parts, fixedly connected therebetween by a weight transducer and rotatably mounted therewith supplying electrical signals transmitted to a first electronic processing circuit fixed to said pulling spindle; said first electronic processing circuit supplying electrical signals, which are transmitted to a second electronic processing circuit, which is independent of said pulling spindle, by an electro-optical system positioned along the axis of said spindle between said first electronic processing circuit and said carriage; further comprising an electric power supply for said first electronic processing circuit, which is independent of said pulling spindle, and a transformer positioned between said carriage and said pulling spindle through which said power supply is electrically connected in contactless manner to said first electronic processing circuit; and means for supplying control instructions to said first processing circuit independent of said pulling spindle, and capacitive coupling means positioned between said carriage and said pulling spindle and electrically connected in contactless manner with, said means for supplying control instructions to said first electronic processing circuit and wherein said weight transducer comprises an outer part integral with a first portion of said pulling spindle and centered along the axis of the latter via centering means, and an inner part integral with a second portion of said pulling spindle and centered along the axis thereof by second centering means, and means for measuring the relative displacement between said two parts along the axis of said spindle.

2. A pulling machine according to claim 1, wherein said weight transducer is disposed in a thermally insulating enclosure integral with said carriage.

3. A pulling machine according to claim 2, wherein said machine further comprises a temperature detecting device and heating means disposed in the said enclosure, an outer regulating circuit sensitive to the signal supplied by said temperature detecting device controlling said heating means, whereby to maintain the temperature of said weight transducer at a constant value.

4. A pulling machine according to claim 1, wherein said spindle comprises at least one portion made from an insulating material.

5. A pulling machine according to claim 1, wherein said electrooptical system comprises an optoelectronic transmitter and receiver which face one another along the axis of said spindle and are respectively joined to said first electronic processing circuit and to said carriage.

6. A pulling machine according to claim 1, wherein the outer part of said weight transducer is centered on said first portion along the axis of said pulling spindle by a bevel shoulder, the inner part having a portion which projects relative to the outer part and located in a blind hole formed in the second portion of said pulling spindle, in order to center said inner part along the axis of the latter.

7. A pulling machine according to claim 1, wherein said pulling spindle comprises dismantable means by which a lower part of said spindle is removably connected to an upper part of said spindle.

8. A pulling machine according to claim 1, wherein said carriage comprises a first portion carrying said guidance means and said screw nut, a second portion carrying said pulling spindle and said second control means, said second carriage portion and said pulling spindle essentially having a symmetry of revolution about the axis of said spindle, and rigid, regulatable connecting means between said two carriage portions, whereby to effect a desired vertical orientation to said spindle axis.

9. A pulling machine according to claim 1, wherein said means for guiding said carriage relative to said frame comprises at least one guide rail integral with said frame and at least two pairs of vertically spaced rollers, carried by said carriage and rolling on the said rail.

* * * * *